(12) United States Patent
Olsson et al.

(10) Patent No.: US 8,669,823 B1
(45) Date of Patent: Mar. 11, 2014

(54) OVENIZED MICROELECTROMECHANICAL SYSTEM (MEMS) RESONATOR

(75) Inventors: Roy H. Olsson, Albuquerque, NM (US); Kenneth Wojciechowski, Albuquerque, NM (US); Bongsang Kim, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 52 days.

(21) Appl. No.: 13/442,689

(22) Filed: Apr. 9, 2012

Related U.S. Application Data

(60) Provisional application No. 61/473,495, filed on Apr. 8, 2011.

(51) Int. Cl.
*H03B 5/30* (2006.01)

(52) U.S. Cl.
USPC .......................... 331/154; 331/158; 331/176

(58) Field of Classification Search
USPC .................................. 331/70, 154, 158, 176
See application file for complete search history.

(56) References Cited

U.S. PATENT DOCUMENTS

| | | |
|---|---|---|
| 7,385,334 B1 | 6/2008 | Olsson et al. |
| 7,616,077 B1 | 11/2009 | Wittwer et al. |
| 7,652,547 B1 | 1/2010 | Wittwer et al. |
| 7,733,198 B1 | 6/2010 | Olsson et al. |
| 7,836,566 B1 | 11/2010 | Olsson et al. |
| 7,859,350 B1 | 12/2010 | Schwindt et al. |
| 8,094,023 B1 | 1/2012 | El-Kady et al. |
| 8,367,305 B1 | 2/2013 | Wojciechowski et al. |
| 8,497,747 B1 | 7/2013 | Wojciechowski et al. |
| 8,508,370 B1 | 8/2013 | El-Kady et al. |
| 8,525,619 B1 | 9/2013 | Olsson et al. |
| 2004/0207492 A1* | 10/2004 | Nguyen et al. ................ 333/199 |
| 2010/0315179 A1* | 12/2010 | Schoepf et al. ............... 333/186 |

OTHER PUBLICATIONS

Choi, S. et al., "Thermal Conductivity of AlN and SiC Thin Films," International Journal of Thermophysics, vol. 27, 2006, pp. 896-905.

Fedder, G.K. et al., "Technologies for Cofabricating MEMS and Electronics," Proceedings of the IEEE, vol. 96, 2008, pp. 306-322.

Hsu, W.T. et al., "Frequency Trimming for MEMS Resonator Oscillators," IEEE International Frequency Control Symposium Joint with the $21^{st}$ European Frequency and Time Forum, 2007, pp. 1088-1091.

Huang, W.L. et al., "Fully Monolithic CMOS Nickel Micromechanical Resonator Oscillator," Micro Electro Mechanical Systems 2008 (MEMS 2008), IEEE 21st International Conference in Tucson, Arizona, 2008, pp. 10-13.

Jha, C.M. et al., "Thermal Isolation of Encapsulated MEMS Resonators," Journal of Microelectromechanical Systems, vol. 17, 2008, pp. 175-184.

Kato, R. et al., "Thermal Conductivity Measurement of Submicron-Thick Films Deposited on Substrates by Modified ac Calorimetry (Laser-Heating Angstrom Method)," International Journal of Thermophysics, vol. 22, 2001, pp. 617-629.

(Continued)

*Primary Examiner* — Joseph Chang
*Assistant Examiner* — Jeffrey Shin
(74) *Attorney, Agent, or Firm* — Helen S. Baca

(57) ABSTRACT

An ovenized micro-electro-mechanical system (MEMS) resonator including: a substantially thermally isolated mechanical resonator cavity; a mechanical oscillator coupled to the mechanical resonator cavity; and a heating element formed on the mechanical resonator cavity.

19 Claims, 10 Drawing Sheets

(56) References Cited

OTHER PUBLICATIONS

Kim, B. et al., "Ovenized and Thermally Tunable Aluminum Nitride Microresonators," International Ultrasonics Symposium (IUS) Proceedings, San Diego, California, 2010, pp. 974-978.

Kim, B. et al., "Oven-Based Thermally Tunable Aluminum Nitride Microresonators," Journal of Microelectromechanical Systems, vol. 22, 2013, pp. 265-275.

Olsson, R.H. et al., "Multi-Frequency Aluminum Nitride Micro-Filters for Advanced RF Communications," Government Microcircuit Application and Critical Technology Conference, 2010, pp. 257-260.

Olsson, R.H. et al., "Post-CMOS Compatible Aluminum Nitride MEMS Filters and Resonant Sensors," IEEE Frequency Control Symposium, Geneva, Switzerland, 2007, pp. 412-419.

Olsson, R.H. et al., "VHF and UHF Mechanically Coupled Aluminum Nitride MEMS Filters," IEEE International Frequency Control Symposium, Honolulu, Hawaii, 2008, pp. 634-639.

Piazza, G. et al., "Single-Chip Multiple-Frequency AlN MEMS Filters Based on Contour-Mode Piezoelectric Resonators," Journal of Microelectromechanical Systems, vol. 16, 2007, pp. 319-328.

Schwindt, P.D.D. et al., "Micro Ion Frequency Standard," Proceedings of the 41st Annual Precise Time and Time Interval Systems and Applications Meeting, Santa Ana Pueblo, New Mexico, Nov. 2009, pp. 509-518.

Wojciechowski, K.E. et al., "Parallel Lattice Filters Utilizing Aluminum Nitride Contour Mode Resonators," Solid-State Sensors, Actuators, and Microsystems Workshop, Hilton Head, South Carolina, 2010, pp. 65-69.

Wojciechowski, K.E. et al., "Single-Chip Precision Oscillators Based on Multi-Frequency, High-Q Aluminum Nitride MEMS Resonators," International Conference on Solid State Sensors and Actuators and Microsystems, Transducers '09, vol. 2, Denver, Colorado, 2009, pp. 2126-2130.

Wojciechowski, K.E. et al., "Super High Frequency Width Extensional Aluminum Nitride (AlN) MEMS Resonators," IEEE International Ultrasonic Symposium Proceedings, Rome, Italy, 2009, pp. 1179-1182.

Zhao, Y. et al., "Pulsed Photothermal Reflectance Measurement of the Thermal Conductivity of Sputtered Aluminum Nitride Thin Films," Journal of Applied Physics, vol. 96, 2004, pp. 4563-4568.

* cited by examiner

OVENIZED MICROELECTROMECHANICAL SYSTEM (MEMS) RESONATOR

CROSS-REFERENCE TO RELATED APPLICATIONS

This application claims priority of U.S. Provisional Application No. 61/473,495, filed on Apr. 8, 2011. U.S. Provisional Application No. 61/473,495 is incorporated by reference herein.

This invention was developed under Contract DE-AC04-94AL85000 between Sandia Corporation and the U.S. Department of Energy. The U.S. Government has certain rights in this invention.

TECHNICAL FIELD

The present invention is directed generally to temperature controlled microelectromechanical system (MEMS) resonators, and, more particularly, to MEMS resonators with integrated heater elements.

BACKGROUND OF THE INVENTION

Recent advances in radio frequency microelectromechanical systems (RF MEMS) technologies have demonstrated on-chip integration of high-frequency signal processors alongside transistor circuits. In particular, aluminum nitride (AlN) based microresonators have been demonstrated with performance metrics which are readily applicable to modern wireless communication systems, i.e. low insertion loss, high f·Q product, and low motional impedance (sub 50Ω). In addition, the use of AlN in these microresonators allows these systems to be manufactured using micromachining technology, which may allow for features such as small form factor, CAD-definable frequency, and low cost due to batch-fabrication. These attributes make aluminum nitride-based micromechanical resonators a promising candidate for application in future generation wireless communication systems.

Despite all these advantages, however, there have been very few studies on the tuning methods of AlN resonators. The shortage of effective frequency tuning methods has limited the use of these resonators in timing applications where initial frequency accuracy is desirably tightly controlled. Deviation of the absolute frequencies of the fabricated resonators from the desired frequency is typical due to tolerances in the fabrication process. For example, an initial frequency variation of a few 1000s of ppm across a 6 inch wafer has been observed among AlN microresonators fabricated at Sandia National Laboratories. However, this is not a production process. Still it may be difficult to achieve 10s of ppm for the initial accuracy that is desired in timing applications, even with the rigor of production level process control. In addition, it is desirable for frequency shifts due to environment effects, such as temperature changes, to be compensated in high-precision applications.

Exemplary embodiments of the present invention may improve thyristor control in high current density applications, as well as applications in an ionizing radiation environment. These and other advantages of the present invention may be understood by those skilled in the art from the following detailed description.

SUMMARY OF THE INVENTION

An exemplary embodiment of the present invention is an ovenized micro-electro-mechanical system (MEMS) resonator including: a substantially thermally isolated mechanical resonator cavity; a mechanical oscillator coupled to the mechanical resonator cavity; and a heating element formed on the mechanical resonator cavity.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF THE INVENTION

Ovenization, or localized heating, has been demonstrated as an effective way for the frequency tuning of micromachined resonators. Unlike quartz crystal resonators, lithography-based micromachining technology allows integration of heaters very close to the resonators enabling highly efficient localized device heating. Previous oven-based micro-electromechanical system (MEMS) resonators have demonstrated 12 mW power consumption for a 125° C. temperature rise, which is several orders of magnitude smaller than that of their quartz based counter parts, oven-controlled crystal oscillators (OCXO). However, these single crystal silicon-based structures were not optimally designed so that the supplied power may be fully utilized for resonator heating. By using the supporting beams as heaters, only part of the generated heat could be used for the resonator heating, while the rest was wasted as leakage through the substrate. Exemplary embodiments of the present invention use a different approach that may provide increased power efficiency of ovenized micromechanical resonators. In these exemplary embodiments, heating elements are placed on a thermally isolated structure together with the resonators, desirably minimizing heat leakage. Exemplary embodiments of the present invention include embodiments in which thin film-deposited polycrystalline AlN is used as a supporting beam material for the ovenized micromechanical resonators. Heat transfer through these thin film-deposited polycrystalline AlN supporting beams may be limited because the small grain size of the material enhances phonon boundary scattering.

Figure 1:
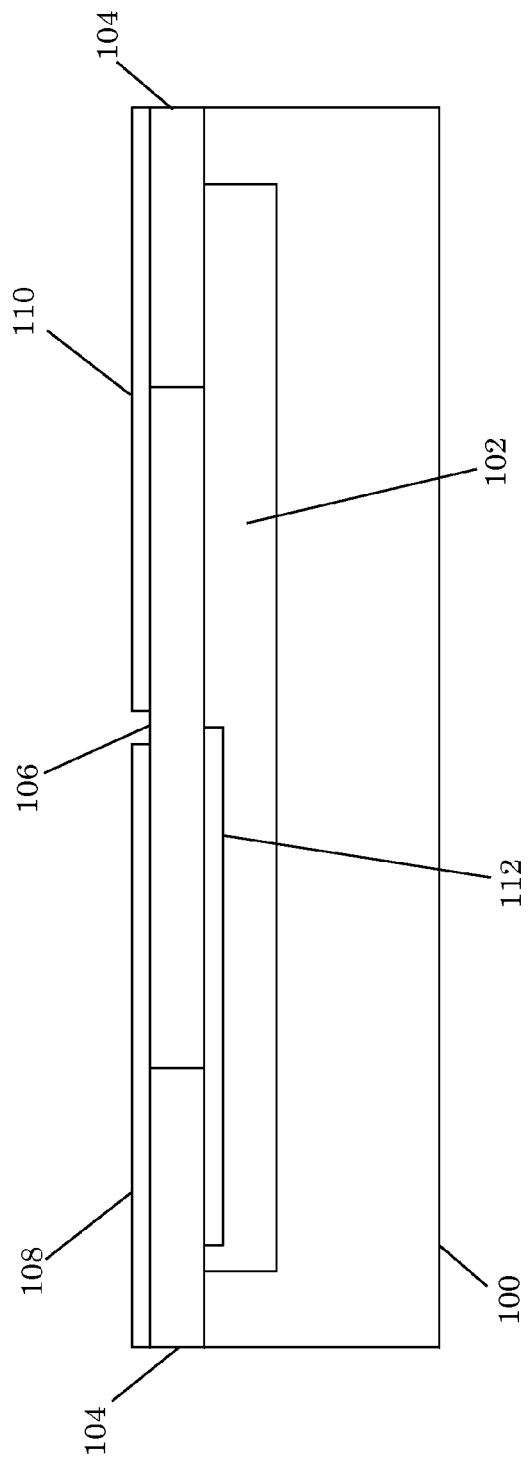
FIG. 1 is a side plan drawing of an exemplary ovenized micro-electro-mechanical system (MEMS) resonator with an integrated heater element according to an exemplary embodiment of the invention.

FIG. 1 illustrates an exemplary ovenized MEMS resonator according to the present invention. The exemplary ovenized MEMS resonator includes: a substantially thermally isolated mechanical resonator cavity; a mechanical oscillator coupled to the substantially thermally isolated mechanical resonator cavity; and heating element 110 formed on the substantially thermally isolated mechanical resonator cavity.

The substantially thermally isolated mechanical resonator cavity of this exemplary ovenized MEMS resonator includes: substrate 100; resonator cavity 106; and thermally isolating beams 104 coupled between substrate 100 and resonator cavity 106. Although the exemplary ovenized MEMS resonator in FIG. 1 is illustrated with two thermally isolating beams 104 suspending resonator cavity 106 over open void 102 to form the substantially thermally isolated mechanical resonator cavity, it is contemplated that other configurations may be employed in which only one thermally isolating beam is used, or in which a greater number of thermally isolating beams is used, such as in the exemplary ovenized MEMS resonator illustrated in FIG. 2. Desirably, thermally isolating beams are disposed between substrate 100 and resonator cavity 106 such that substrate 100 and resonator cavity 106 are not in direct contact.

In many applications, exemplary ovenized MEMS resonators according to the present invention, such as the exemplary ovenized MEMS resonator illustrated in FIG. 1, are desirably operated in a vacuum, or near vacuum environment. In such applications, there is very little heat transfer due to convection. And as these exemplary ovenized MEMS resonators are desirably operated near room temperature, radiative heat transfer is minimal as well. Thus, the primary source of heat transfer in exemplary embodiments of the present invention is likely to be conduction through thermally isolating beams 104. In these exemplary embodiments, the thermal conductivity of thermally isolating beams 104 is desirably reduced both through geometry and through material selection.

Geometrically, thermally isolating beams 104 desirably have a large length to width aspect ratio.

Regarding material selection, it is contemplated that resonator cavity 106 may be formed of aluminum nitride (AlN) or a similar material. AlN has advantages over a number of other candidate materials due to its compatibility with standard CMOS processing procedures, and its ability to function as a piezoelectric material; however, one skilled in the art will understand that other materials may exhibit similar electromechanical and thermal properties to AlN. Additionally, although the thermal conductivity of bulk AlN is relatively high, Applicants have demonstrated that the thermal conductivity of thin film polycrystalline AlN is significantly lower than that of bulk AlN, making it a desirable candidate material for thermally isolating beams 104. Further, for exemplary ovenized MEMS resonators in which resonator cavity 106 and thermally isolating beams 104 are formed of AlN, heating element 110 may desirably be a resistive heating element formed of aluminum.

As noted above, one reason that AlN may be a desirable material for resonator cavity 106 is the ability of AlN to function as a piezoelectric material. Thus, resonator cavity 106 may function, in conjunction with drive electrode 108 and ground electrode 112, as the mechanical oscillator of an exemplary ovenized MEMS resonator according to the present invention, as well as part of its substantially thermally isolated mechanical resonator cavity.

Figure 2A:
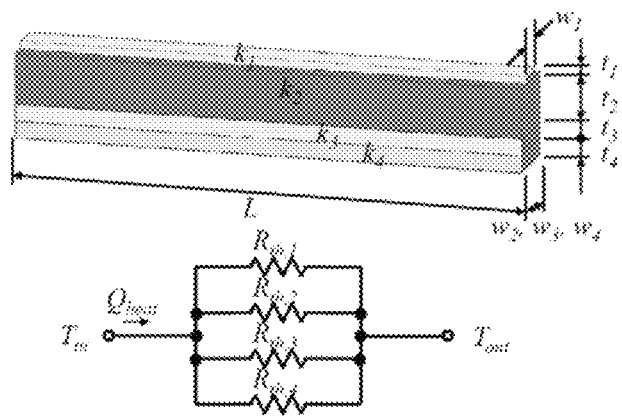
FIG. 2 shows (A) heat transfer through conduction of a stacked beam can be modeled by thermal resistors connected in parallel as described in equation (1). (B) Thermal characteristics of the ovenized resonators can be approximated as the illustrated thermal circuit model, where
FIG. 2B is a three dimensional perspective drawing of an exemplary ovenized MEMS resonator with integrated heater elements according to an exemplary embodiment of the invention.
Figure 2B:
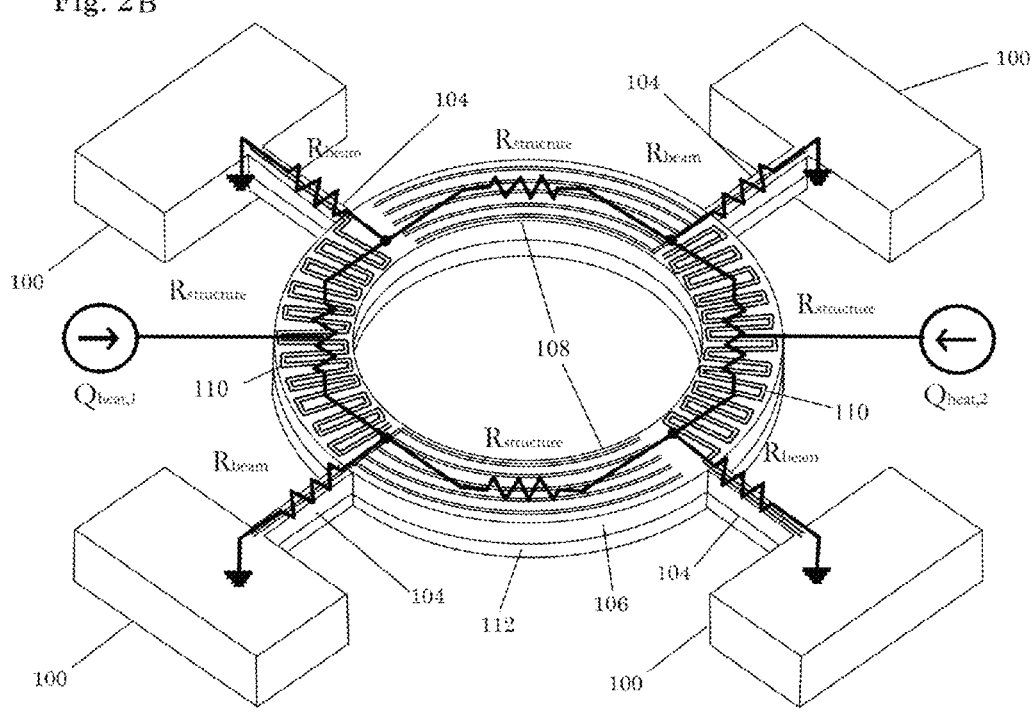

FIG. 2 illustrates exemplary ovenized MEMS ring resonator 200 according to the present invention. In this exemplary embodiment, resonator cavity 106 is formed as a ring and suspended from substrate 100 by four thermally isolating beams 104, which are equally arranged around the circumference of circular resonator cavity 106. One skilled in the art will understand that the choice of a ring resonator is for illustrative purposes only, and that other resonator shapes, such as a disk resonator may be selected as well.

FIG. 2 also illustrates a heat flow diagram for this exemplary embodiment, demonstrating how heat provided by heating elements 110, which are located on quadrants of resonator cavity 106 opposite each other, with mechanical oscillator sections (defined by drive electrodes 108) in the intervening quadrants, flows around resonator cavity 106 and out thermally isolating beams 104 to dissipate in substrate 100. The oscillator electrical traces (i.e. drive electrodes 108) for these exemplary mechanical oscillators are formed on corresponding thermally isolating beams 104 and the heating element electrical traces for heating elements 110 are formed on corresponding thermally isolating beams in this exemplary embodiment.

It is noted that exemplary heating elements 110 are illustrated as serpentine resistive heating elements and exemplary drive electrodes 108 are illustrated as concentric comb structures in the exemplary embodiment of FIG. 2. These specific configurations are intended to be illustrative and not limiting.

Exemplary ovenized MEMS resonators according to the present invention may also desirably include a temperature sensor thermally coupled to the substantially thermally isolated mechanical resonator cavity. The temperature sensor may be couple to control circuitry to control the current supplied to the heating element(s) formed on the substantially thermally isolated mechanical resonator cavity.

Exemplary ovenized MEMS resonators having resistive heating elements, such as exemplary ovenized MEMS resonator 200 of FIG. 2, may desirably include control circuitry (not shown) that is electrically coupled to the resistive heating elements. The resistance of resistive heating elements is thermally dependent. Thus, this control circuitry may desirably include sensor circuitry to sense the relative resistance of the resistive heating element and drive circuitry to control the current provided to the resistive heating element based on the sensed relative resistance.

EXAMPLES

Example 1

Ovenized and Thermally Tunable Aluminum Nitride Microresonators

Abstract: Frequency tuning of aluminum nitride (AlN) microresonators has been demonstrated via localized heating (ovenization) of the resonator. Specifically, piezoelectrically driven 625 MHz microresonators were heated by embedded joule heaters in vacuum. A temperature increase of 135° C. was achieved with only 2.8 mW of power consumption. This increase corresponds to ~4500 ppm of frequency shift. To minimize heat loss, the devices were suspended from the substrate by high thermal isolation beam type supports. The beams exhibit very high thermal resistance, not only due to their high length to cross-sectional area ratio, but also because they are made of thin-film deposited polycrystalline aluminum nitride. Thin AlN films have been shown to have thermal conductivities that are much lower than that measured in bulk materials. The availability of a power efficient frequency tuning method in aluminum nitride microresonators enables low power ovenization of AlN MEMS-based timing devices and tunable filtering for communication systems.

Introduction

Recent advances in radio frequency microelectromechanical systems (RF MEMS) technologies have demonstrated on-chip integration of high-frequency signal processors alongside transistor circuits (K. E. Wojciechowski et al., "Single-chip precision oscillators based on multi-frequency, high-Q aluminum nitride MEMS resonators," in International Conference on Solid State Sensors and Actuators and Microsystems, TRANSDUCERS '09. vol. 2 Denver Colo. USA, 2009, pp. 2126-2130; W.-L. Huang et al., "Fully monolithic CMOS nickel micromechanical resonator oscillator," in Micro Electro Mechanical Systems, 2008. MEMS 2008. IEEE 21st International Conference on Tucson, Ariz., 2008, pp. 10-13; and G. K. Fedder et al., "Technologies for Cofabricating MEMS and Electronics," Proceedings of the IEEE, vol. 96, pp. 306-322, 2008). In particular, aluminum nitride-based microresonators have been demonstrated with performance metrics which are readily applicable to modern wireless communication systems, i.e. low insertion loss, high Q product, and low motional impedance (sub 50Ω) (R. H. Olsson et al., "Multi-Frequency Aluminum Nitride Micro-Filters for Advanced RF Communications," in Government Microcircuit Application and Critical Technology Conference, 2010, pp. 257-260; G. Piazza et al., "Single-Chip Multiple-Frequency AlN MEMS Filters Based on Contour-Mode Piezoelectric Resonators," Journal of MicroElectroMechanical Systems, vol. 16, pp. 319-328, 2007; K. E. Wojciechowski et al., "Super high frequency width extensional aluminum nitride MEMS resonators," in IEEE Ultrasonics Symposium, Rome, Italy, 2009, pp. 1179-1182; and K. E. Wojciechowski and R. H. Olsson, "Parallel Lattice Filters Utilizing Aluminum Nitride Contour Mode Resonators," in Solid-State Sensors, Actuators, and Microsystems Workshop, Hilton Head 10, Hilton Head, S.C., USA, 2010, pp. 65-69). In addition, AlN provides the advantages of micromachining technology, such as small form factor, CAD-definable frequency, and low cost due to batch-fabrication. These attributes make aluminum nitride-based micromechanical resonators a promising candidate for application in future generation wireless communication systems.

Despite all these advantages, however, there have been very few studies on the tuning methods of aluminum nitride resonators. The shortage of effective frequency tuning methods prevents its use in timing applications where initial frequency accuracy must be tightly controlled. Deviation of the absolute frequencies of the fabricated resonators from the desired frequency is unavoidable due to the process (W.-T. Hsu et al., "Frequency Trimming for MEMS Resonator Oscillators," in Frequency Control Symposium, 2007 Joint with the 21st European Frequency and Time Forum. IEEE International, 2007, pp. 1088-1091). For example, an initial frequency variation of a few 1000s of ppm across a 6 inch wafer has been observed among AlN microresonators fabricated at Sandia National Laboratories. It should be pointed out that this is not a production process. However, it may be difficult to achieve 10s of ppm initial accuracy that is desired for timing applications with the rigor of production level process control. In addition, frequency shifts due to environment effects, such as temperature changes, have to be compensated for high-precision applications.

Indeed, ovenization, or localized heating, has been demonstrated as an effective way for the frequency tuning of micromachined resonators (C. M. Jha et al., "Thermal isolation of encapsulated MEMS resonators," Journal of Microelectromechanical Systems, vol. 17, pp. 175-184, February 2008). Unlike quartz crystal resonators, lithography-based micromachining technology allows integration of heaters very close to the resonators enabling highly efficient localized device heating. Previous oven-based MEMS resonators (C. M. Jha et al., "Thermal isolation of encapsulated MEMS resonators," Journal of Microelectromechanical Systems, vol. 17, pp. 175-184, February 2008) have demonstrated 12 mW power consumption for a 125° C. temperature rise, which is several orders of magnitude smaller than their quartz based counter parts, OCXO (oven-controlled crystal oscillators). However, the demonstrated single crystal silicon-based structures were not optimally designed so that the supplied power could be fully utilized for resonator heating. By using the supporting beams as heaters, only part of the generated heat could be used for the resonator heating, while the rest was wasted as leakage through the substrate. In this work, we propose a more sophisticated approach for further improvement in the power efficiency of ovenized micromechanical resonators. First, heaters are placed on a thermally isolated structure together with the resonators, minimizing unwanted heat leakage. Second, thin film-deposited polycrystalline AlN is used as the supporting beam material, in which heat transfer is very limited because its small grain size enhances phonon boundary scattering.

Device Design

FIG. 2 illustrates a schematic of the proposed design. A ring-shaped structure was employed as a platform, where resonators and heaters are placed symmetrically on its four sides. The symmetry was intended to provide constant temperature across the resonators. The ring is suspended above the substrate by only four high thermal isolation beams. The device consists of a stack of four different layers; aluminum electrode layer, AlN transducer layer, metal electrical ground layer, and silicon dioxide layer. The thicknesses and material characteristics of each layer are summarized in Table 1.

TABLE 1.

Thicknesses and material parameters of each microresonator layer.

| Layer Material | 1 metal | 2 AlN | 3 metal | 4 SiO$_2$ |
|---|---|---|---|---|
| $t_i$, thickness (nm) | 100 | 400 | 120 | 100 |
| $E_i$, Young's Modulus (GPa) | 69 | 342 | 153 | 75 |
| $\rho_i$, density (kg/m$^3$) | 3230 | 2700 | 4350 | 2200 |
| TCE$_i$, (ppm/K) | −590 | −37 | −290 | 185 |
| $k_i$, thermal conductivity (W/m-K) | 237 | 60 | 110 | 1.4 |

Thermally Isolated Device Structure: The thermal circuit model of the proposed structure illustrated in FIG. 2 provides useful guidance for analyzing device thermal characteristics. The resonator is operated in vacuum to minimize contamination and air-damping, thus the convectional heat transfer becomes almost negligible. Radiation heat transfer has not been considered because of its near room temperature operation (−55~125° C.). The dominant heat transfer mechanism is conduction through the supporting beams. The effective thermal resistance can be modeled as parallel coupled thermal resistors representing each layer in the device, thus, $$R_{th,cond} = \frac{\Delta T}{q} = \frac{1}{\sum 1/R_{Th,i}} = \frac{1}{\sum k_i A_i / L} = \frac{L}{\sum k_i \cdot t_i \cdot w_i} \quad (1)$$

where, $\Delta T$ is the temperature difference, q is the heat flux, L is the conductor length, and $k_i$, $l_i$, and $w_i$, are thermal conductivities, thicknesses, and widths of each layer.

The thermal conductivity of thin-film deposited AlN has been reported to be several orders of magnitude smaller than that of bulk materials ($k_{AlN, bulk}$~285 W/mK). It has been explained that phonon transport is impeded by an increase in boundary scattering due to a reduction in crystal gain size (S. Choi et al., "Thermal Conductivity of AlN and SiC Thin Films," International Journal of Thermophysics, vol. 27, pp. 896-905, 2006; R. Kato et al., "Thermal Conductivity Measurement of Submicron-Thick Films Deposited on Substrates by Modified ac Calorimetry (Laser-Heating Angstrom Method)," International Journal of Thermophysics, vol. 22, pp. 617-629, 2001; and Y. Zhao et al., "Pulsed photothermal reflectance measurement of the thermal conductivity of sputtered aluminum nitride thin films," Journal of applied physics, vol. 96, pp. 4563-4568, 2004) and due to scatting of the top and bottom surface of the thin film. Therefore, in this work, the use of thin-film deposited AlN as the structural material results in increased thermal resistance. For high thermal isolation, beam-type supports were also designed to have large length-to-width ratio. It should be noted that this initial beam length was designed conservatively and longer lengths providing even higher thermal isolation will be investigated. Using equation (1), the thermal resistance of each conducting path in FIG. 2B was estimated as $R_{structure}$=109,000 K/W and $R_{beam}$=160,000 K/W, respectively.

Heaters and Temperature Sensors: Two serpentine-shaped, 250 nm wide aluminum heaters/resistors were placed symmetrically on the ring-shaped platform as shown in FIG. 2. These resistors function as both heaters and temperature sensors. The measured heater resistance was found to be $R_s$~4.6 kΩ at room temperature. To heat the device, current is supplied from one end, and the power is dissipated as thermal energy. The temperature shift can be estimated by measuring the resistance change, as the electrical conductivity of the metal decreases with rising temperature.

Figure 3:
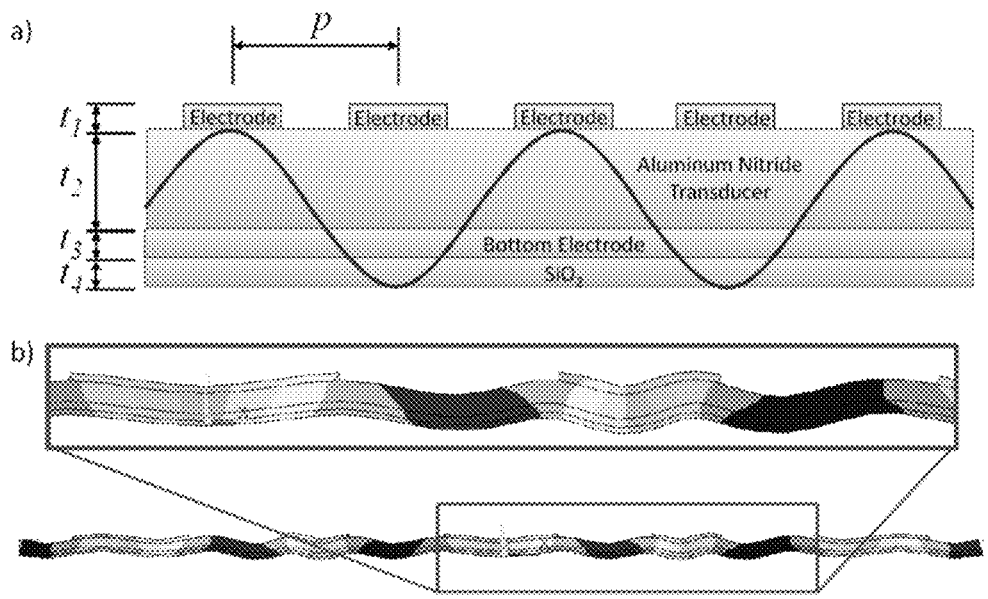
FIG. 3 shows (A) a resonator cross-section schematic. The resonant frequency is determined by the electrode pitch as the half wavelength of the propagating wave. These electrodes are defined by CAD layout, therefore devices with various resonant frequencies can be simultaneously fabricated on a single wafer. (B) ANSYS finite element simulation of the mode shape.

Resonant Frequency and the Temperature Dependence: FIG. 3 shows the cross-section schematic and the mode shape of a lateral contour mode resonator consisting of the film stack given above. When the wave propagates, each film act as parallel coupled sub-resonators, and the resulting acoustic velocity, r, and resonant frequency, f are, $$v = \sqrt{\frac{\sum t_i \cdot E_i}{\sum t_i \cdot \rho_i}}, f = \frac{v}{2p} = \frac{1}{2p}\sqrt{\frac{\sum t_i \cdot E_i}{\sum t_i \cdot \rho_i}} \quad (2)$$

where, E, is the Young's modulus and $\rho_i$ is the mass density of each film. The pitch of the electrodes, p, is defined lithographically from the CAD layout. Therefore, the lateral mode of operation is useful when multiple resonators with different frequencies are needed on a single wafer. These types of AlN resonators have much higher power handling capabilities compared to the electrostatic resonators in C. M. Jha et al., "Thermal isolation of encapsulated MEMS resonators," Journal of Microelectromechanical Systems, vol. 17, pp. 175-184, February 2008, therefore oscillators referencing these resonators have already demonstrated communication grade phase noise performance (R. H. Olsson et al., "Multi-Frequency Aluminum Nitride Micro-Filters for Advanced RF Communications," in Government Microcircuit Application and Critical Technology Conference, 2010, pp. 257-260).

The partial derivative of equation (2) with respect to temperature can be used to estimate the resonator's temperature coefficient of frequency, TCf, $$TCf = \frac{1}{2}\frac{\sum t_i \cdot E_i \cdot TCE_i}{\sum t_i \cdot E_i}, \quad (3)$$

where, TCE$_i$ is the temperature dependence of Young's moduli of each film. A total of five electrodes were placed with a pitch (λ/2, half wavelength) of 4 µm. Given the thickness and material parameters summarized in Table 1, the resonators were designed to have a resonant frequency of ~623 MHz with a TCf of −38 ppm/C.

Measurement

Device Characterization: The designed ovenized AlN microresonators were surface-micromachined as shown in the SEM image in FIG. 4A. The detailed fabrication process is described in R. H. Olsson et al., "Post-CMOS Compatible Aluminum Nitride MEMS Filters and Resonant Sensors," in IEEE Frequency Control Symposium, Geneva, Switzerland, 2007, pp. 412-419.

Figure 5:
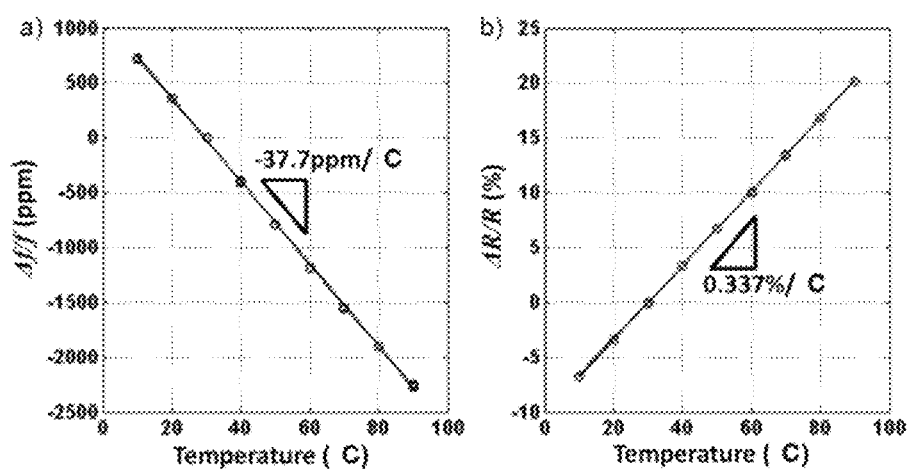
FIG. 5 shows measured data of wafer-scale heating experiment. Changes in both (A) resonator resonant frequency and (B) heater resistance were measured while the entire wafer was heated. From these measurements, TCf=−37.7 ppm/° C. and TCR=0.337%/° C. were characterized

First, the device TCf and temperature coefficient of resistance, TCR, were characterized using a heated chuck on a wafer probe station. FIG. 5A shows the measured frequency change with respect to temperature. The TCf was measured to be about −37.7 ppm/° C., which is close to the prediction obtained from equation (3).

The resistivity change of the aluminum traces was also measured in the same experiment. As the temperature changes, a linear temperature coefficient of resistance, TCR, of 0.337%/° C. was measured and is shown in FIG. 5B. The resolution of the temperature calibration using this resistance measurement was estimated as 11μ° C. in a 1 kHz bandwidth assuming thermal and amplifier noise of 5 nV/√Hz.

Thermal Characteristics: The thermal characteristics of the device were investigated in two different configurations, when only one heater was used and when both heaters were used.

Figure 6:
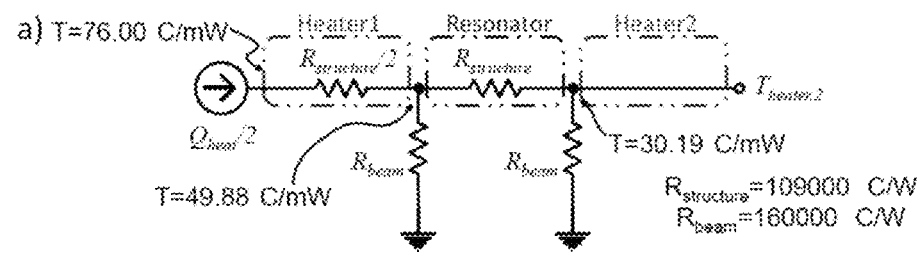
FIG. 6 shows (A) an equivalent thermal circuit model and (B) the ANSYS FE simulation in the case that only one heater was used. A significant temperature gradient is expected across the resonators when this configuration is used. The simulation was modeled with a supplied heating power of 1 mW.
Figure 6:
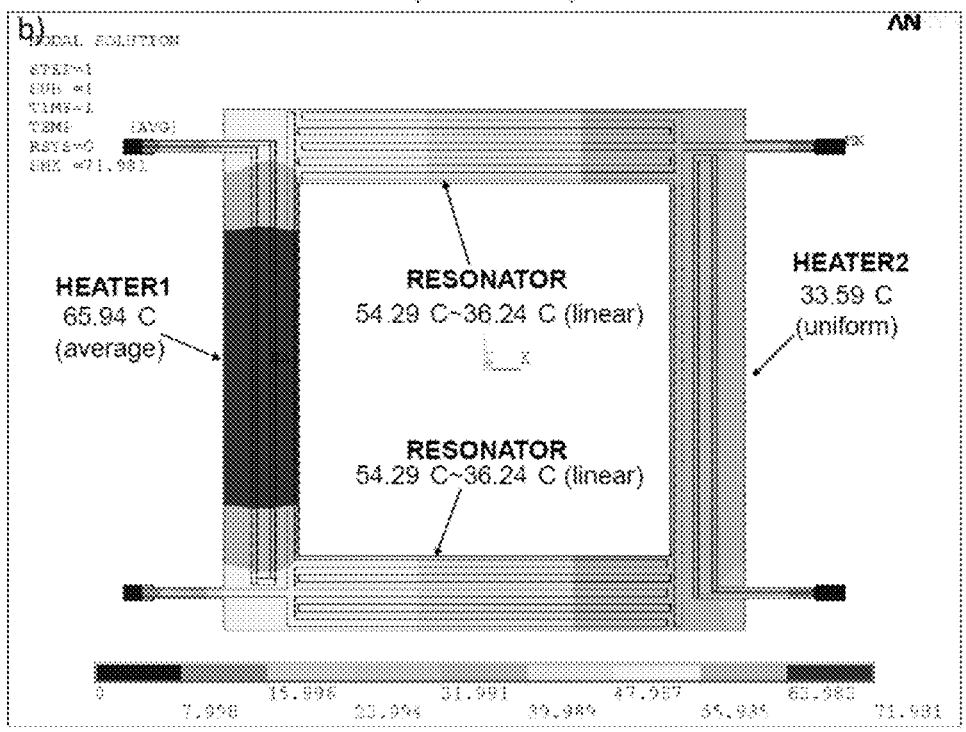

FIG. 6A shows the simplified thermal circuit model in the case where only one heater is used. From this model, the resonator was estimated to experience a temperature gradient between 49.88° C./mW and 30.19° C./mW. These values are close to the prediction of the ANSYS™ finite element simulation shown in FIG. 6B. Here, the floating platform was modeled as a hollow square shape instead of ring shape for easier meshing and calculation, however, their thermal characteristics should be quite similar.

Figure 7:
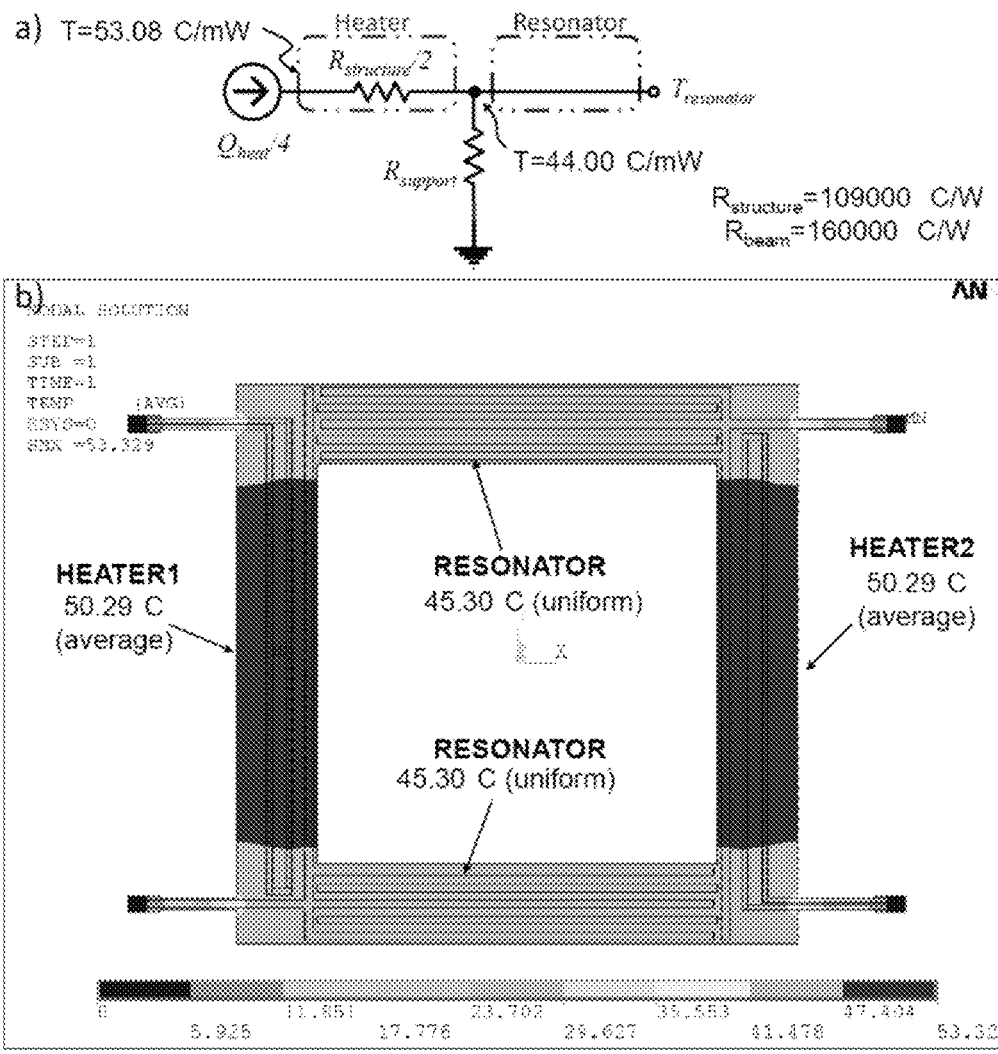
FIG. 7 shows (A) an equivalent thermal circuit model and (B) the ANSYS™ finite element simulation in the case where heaters on both sides of the structure were used. A more uniform temperature distribution across the resonator is expected when this configuration is used. The simulation was modeled with a total supplied heating power of 1 mW (0.5 mW per each heater).

In the second or balanced case, both heaters are driven equally. This provides a uniform heat distribution across the resonators. The simplified thermal circuit model shown in FIG. 7A estimated 40.00° C./mW of uniform temperature distribution across the resonators. This value is similar to that predicted by the finite element model shown in FIG. 7B.

Figure 8:
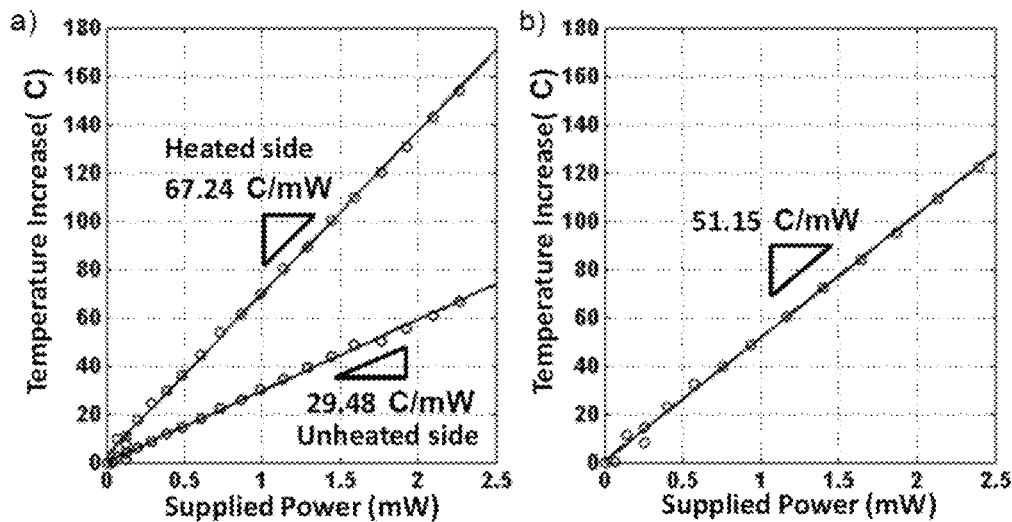
FIG. 8 shows measured temperature data of the case using one heater (A) and two heaters (B). The temperature increase was estimated from the heater resistance measurement using the calibration line shown in FIG. 5B.

To verify these models, a heater performance experiment was conducted. While power was supplied to either one or two heaters, the heater resistance changes were measured and temperature was estimated using the calibration line in FIG. 5B. The measured temperature increase versus supplied power is shown in FIG. 8. As can be seen, the measured values match well with the ANSYS™ finite element model predictions shown in FIG. 6 and FIG. 7.

In both cases, the average temperature of the resonators was increased by 45° C. per mW of heating power from the ANSYS™ finite element simulation. This heater performance is more than 4 times superior to that of C. M. Jha et al., "Thermal isolation of encapsulated MEMS resonators," Journal of Microelectromechanical Systems, vol. 17, pp. 175-184, February 2008.

Figure 9:
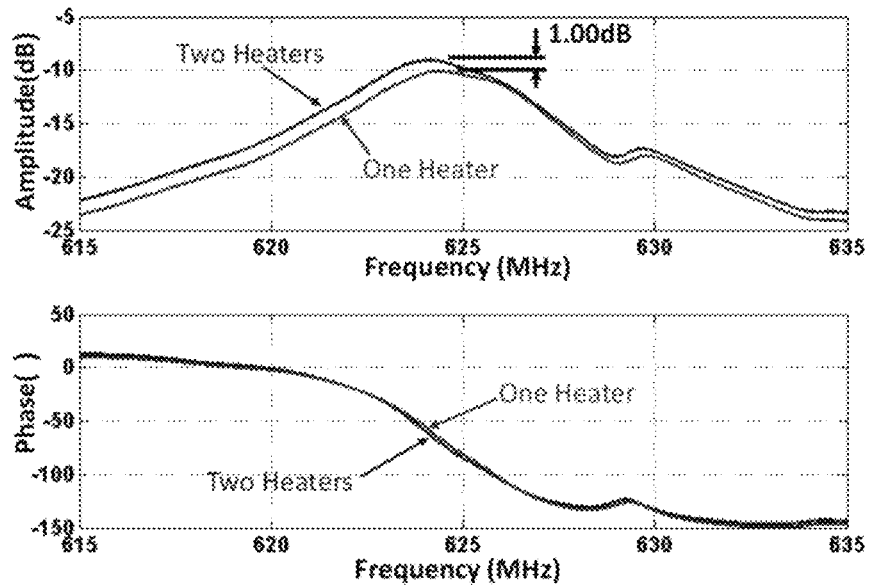
FIG. 9 shows that when one heater is used, the resonator exhibited higher insertion loss compared to the case when two heaters are equally dissipating heat. This performance degradation should be due to the temperature gradient across the resonator from unbalanced heating. In both cases, a heating power of 1.2 mW was supplied through the heaters.

Frequency Tuning via Ovenization: The resonator frequency response was measured in FIG. 9 using the two different heater configurations. The same amount of supplied heating power was applied in both cases. FIG. 9 shows that the resonator insertion loss was 1 dB lower when both heaters were used symmetrically when compared to the one heater case. This is probably due to the more uniform temperature distribution when two heaters are used, whereas the use of one heater generates a temperature gradient across the resonator.

Figure 10:
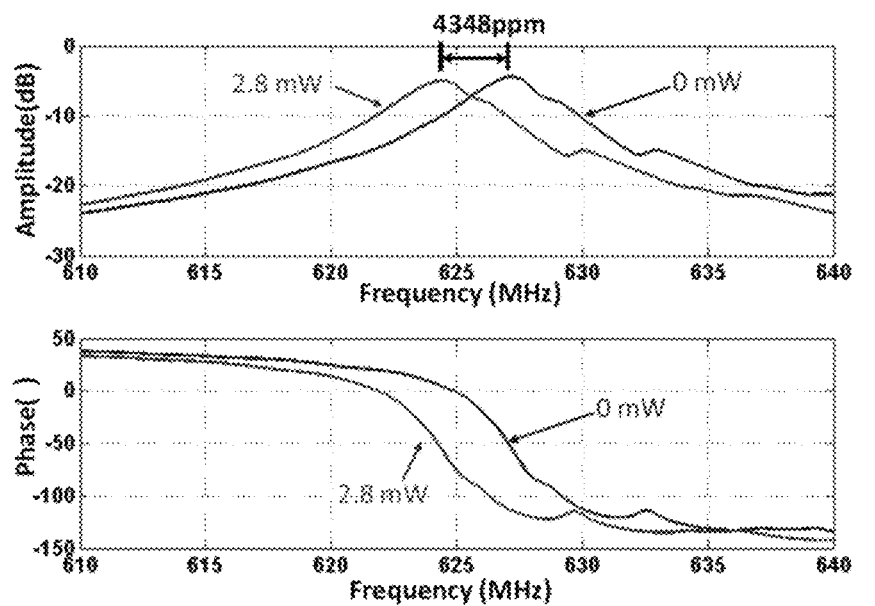
FIG. 10 shows the measured frequency response of the resonator with 2.8 mW heating power (labeled "2.8 mW") and no heating power (labeled "0 mW"). The resonant frequency was decreased by almost 4500 ppm with 2.8 mW of heating power.
Figure 11:
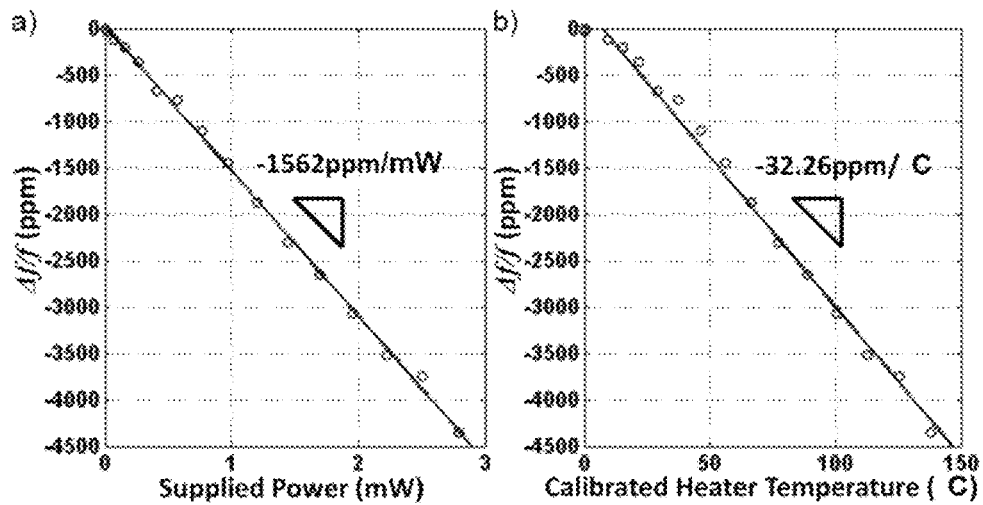
FIG. 11 shows (A) frequency shift vs. supplied heating power. The frequency was shifted by −1200 ppm/mW linearly. (B) Frequency shift vs. calibrated heater temperature from the measurement of the heater resistance and FIG. 5B. This slope is less than that of FIG. 5B because there is temperature gradient between the actual resonator and the heater.

FIG. 10 shows the change in frequency response of a resonator while the heating power was supplied at 0 and 2.8 mW (two heaters were used), resulting in a resonant frequency shift of almost −4500 ppm. FIG. 11A summarizes the measured frequency shift with respect to the supplied power and FIG. 11B shows the frequency change with corresponding heater temperature estimated from the calibration line in FIG. 5B of the resistance change measurement. The measured frequency vs. temperature slope was about 15% less than what had been observed in the heated wafer chuck measurement shown in FIG. 5A. This offset corresponds to the temperature difference between the resonators and the heaters shown in the ANSYS™ finite element simulation in FIG. 7B.

Conclusions

Frequency tuning of ~4500 ppm corresponding to a temperature change of 135° C. in AlN microresonators has been demonstrated using a maximum of 2.8 mW of power. The efficiency of power utilization of the presented oven-based frequency tuning approach is higher than previously demonstrated devices by more than four times (C. M. Jha et al., "Thermal isolation of encapsulated MEMS resonators," Journal of Microelectromechanical Systems, vol. 17, pp. 175-184, February 2008). The demonstrated device could increase the resonator temperature by ~45° C. per mW of heating power, however, use of two heaters in a balanced configuration provides a more uniform temperature distribution for better resonator frequency response.

Further improvement will be possible. For example, ideally, the thermal resistance within the platform structures can be further reduced leading to a more uniform temperature distribution within the platform. By increasing the length and decreasing the width of the supporting beams, increased thermal isolation could be achieved for even higher power efficiency. Thin-film deposited polycrystalline AlN has a highly reduced thermal conductivity compared to bulk AlN material, since its small grain size restricts heat transfer through phonon boundary scattering. Finally, by adjusting the thickness and width of the metal layers, the heat transfer can be easily controlled without impacting the resonator performance such that device thermal isolation is engineered either high or low depending on the application of the resonators.

Example 2

Ultra-Thin, Temperature Stable, Low Power Frequency References

We propose a thin (<100 μm), temperature stable (<2 parts-per-billion (ppb)), low power (<10 mW), frequency reference with cross-cutting applicability across Sandia's DSA and NW missions. Traditional low noise oscillators are based on vibrations in quartz crystals. While a mature technology, the large size and mounting of quartz crystals presents important mission barriers including: reducing oscillator thickness below 400 μm, ovenizing for maximum temperature stability at low power, and shock induced frequency shifts arising from the large crystal mass. While commercial MEMS oscillators are thin and shock tolerant, they utilize weak electrostatic transduction resulting in poor phase noise performance not suitable for communications systems. Recently, Sandia has demonstrated Aluminum Nitride (AlN) MEMS oscillators with 40 dB lower phase noise than commercial MEMS oscillators. While initial results are promising, the temperature sensitivity, 2 parts-per-million (ppm)/C, is too high for precision oscillators. The small volume, microresonators are 2 μm thick compared to 100's of microns for quartz, and substrate isolation, microresonators are suspended above the substrate by narrow beams for acoustic/thermal isolation, provides a new platform for ovenizing oscillators at revolutionary low power levels (<2 mW compared to 1.5 W for quartz). Ovenized oscillators are the gold standard for frequency stability where heaters and temperature sensors are used to maintain the oscillator at a constant temperature above ambient. In this work, we propose to integrate thin film heaters and temperature sensors directly on AlN microresonators to form ovenized oscillators operating from 10-1500 MHz. We will investigate through modeling and experimentation ovenized resonators with different anchoring suspensions, heaters, and sensors to minimize oven and circuit power while maintaining resonator performance and maximizing temperature stability. We will implement low power oscillator and oven control electronics, first at the circuit board and later at the integrated circuit level. This LDRD will demonstrate a multi-frequency low noise oscillator technology with unprecedented frequency stability over temperature (<2 ppb) at this size and power.

LPD electronic devices such as radio frequency (RF) transceivers that must be small and low power are limited in performance and size by the quartz crystals used to provide a stable frequency reference. There are two types of temperature stabilized quartz crystal oscillators, temperature compensated (TCXO) and ovenized (OCXO). OCXOs typically exhibit fractional frequency stability over temperature of less than 1 ppb (i.e. a 100 MHz oscillator would be stable to within 0.1 Hz over temperature) but consume in excess of 1 W to ovenize or maintain the large crystal mass at a constant temperature above ambient. Because of their high power consumption, OCXOs can't be utilized in covert, deployed RF systems, thus TCXOs are employed. Small TCXO's typically consume only a few mW of power but are only stable to within a few ppm over temperature. The variation in oscillator frequency with temperature limits the stability of the frequency reference, particularly in covert, miniaturized RF systems where heat producing electronic components such as power amplifiers (PA) are necessarily located in close proximity to the TCXO. The temperature induced oscillator instability limits the acquisition time, and therefore power consumption, in global positioning system (GPS) receivers. In beacon type RF devices for example, when the device is transmitting the electronics, particularly the PA, heat the TCXO and shift its frequency. This temperature induced frequency instability determines the amount of time the RF device can be usefully interrogated, directly limiting the location accuracy and necessitating interrogators with high performance signal processing that are large, power hungry and increasingly difficult to deploy. Neither TCXOs nor OCXOs can be thinned below a few hundred microns due to performance limitations which set a minimum crystal thickness. In addition both are sensitive to shock due to their large mass. While commercial MEMS oscillators are thin and shock tolerant, they utilize weak electrostatic transduction resulting in poor phase noise (phase noise is equivalent to short term frequency stability) performance not suitable for communications systems. Furthermore, commercial MEMS oscillators are only temperature stable to within 10 ppm and the stability is realized via a fractional-N frequency synthesiser that consumes >5 mW and results in cycles-to-cycle jitter or instantaneous frequency jumps of several ppm. Recently, Sandia has demonstrated AlN MEMS oscillators, based on piezoelectric rather than electrostatic transduction, with 40 dB (that's 4 orders of magnitude) lower phase noise (−90 dBc/Hz@1 kHz offset from 1 GHz carrier) than commercial MEMS oscillators. Due to their small size and thermal/acoustic substrate isolation, these oscillators can be thinned to below 100 µm, exhibit sub ppb/G frequency stability under vibration and can be ovenized to <1 ppb using on resonator heater and temperature sensors in under 2 mW of power. The realization of OXCO frequency stability with TCXO power consumption enabled by this technology is truly revolutionary.

This proposal uses advanced MEMS fabrication, design and modeling capabilities in MESA to achieve a three orders of magnitude reduction in power when compared to the highest stability OCXO frequency references. The project involves coupled physics (piezoelectric, mechanical, electric and thermal) finite element modeling of ovenized resonators along with fabrication and experimental measurements to optimize for high temperature stability, low oven power and low phase noise at different operating frequencies. This project also investigates low noise ovenization circuitry to improve temperature stability and will study the time constant associated with resonator heating from external sources to find the optimum bandwidth of the oven control loop. At the completion of this project, the two great challenges (thermal stability and initial offset) preventing miniaturized MEMS oscillators from being used in communications and other high end electronic systems will be solved using the integrated oven and control electronics. The fundamental research and advanced engineering proposed here will produce an ovenized micro-oscillator technology ready for future development of direct sponsor custom frequency references in short time scales and at low cost.

Sandia's prior AlN microresonator research has been primarily focused on the reduced size and new capabilities provided in filtering applications. While there has been limited oscillator work showing that low phase noise, integration with CMOS, and low vibration sensitivity (0.2 ppb/G) can be achieved, the high temperature coefficient of frequency (TCF), 2 ppm/C, of the resonator made AlN microresonator technology unsuitable for precision oscillators. In September 2009, Sandia began work on a thermally tuned microresonator, shown in FIG. 4, as part of a DARPA chip scale atomic clock (IMPACT) program. The thickness mode 12.6 GHz resonator shown can be heated to 147 C above ambient using only 1.5 mW of power provided a vacuum pressure of <10 Torr (1 Torr vacuum pressures can be maintained without a getter) is maintained around the resonator (the power is 10× higher at ambient pressure). While the DARPA program is limited to tunable resonators to lock to an atomic transition, the results of this initial effort are extremely promising for low power, ovenized, miniature acoustic oscillators. Further measurements on this device demonstrated that the heating element has a resistance of 2.2 kΩ that varies linearly by 7.6 Ω/C. Noise analysis calculations that include the thermal noise of the heater/temp. sensor, amplifier noise, and noise from an oven current driver predict an oven temperature stabilization of 0.5 ppb for a control loop bandwidth of 10 Hz. This proposal seeks to capitalize on this promising discovery, where much research is required to realize a high temperature stability frequency reference at technically relevant frequencies (10-1500 MHz).

Figure 4:
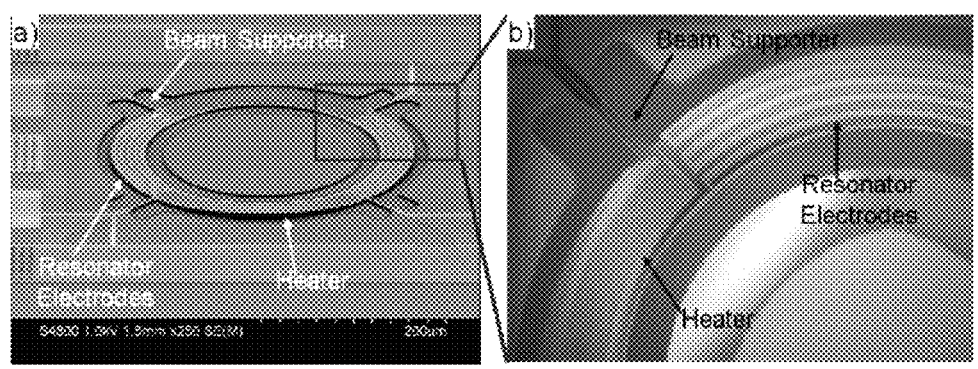
FIG. 4 shows (A) an SEM image of the fabricated device. Both resonators and heaters were placed on a floating ring-shaped platform, and the four beam supports suspend the platform from the substrate. (B) Optical microscopic image of one corner of the fabricated device. Resonator electrodes were placed with 4 µm pitch. Heaters are made out of 250 µm-width and space serpentine aluminum traces.

The unique AlN microresonator properties that allows for low power ovenization and a thin profile can be seen in FIG. 4, where the sub micron thickness of the resonator is clearly visible along with the narrow tethers that suspend the resonator above the substrate providing thermal and mechanical isolation. As these tethers are made longer thermal isolation to the substrate increases and lower power ovens can be achieved. The electrical interconnect resistance to the resonator also increases with the length of the tethers. Because AlN microresonators are low insertion loss, adding electrical resistance beyond a certain level reduces resonator quality factor, Q, and increases oscillator phase noise. If the resonator insertion loss (motional impedance) is increased by making the resonator smaller, longer suspensions can be used before the Q is degraded, but higher gain will be needed in the oscillator positive feedback loop to overcome the added loss, and the amplifier contributions to the phase noise will increase. Smaller resonators, which are higher loss, also require less power to ovenize because of their smaller volume. Increasing the gain in the oscillator feedback loop becomes more expensive, in terms of power, as the oscillator frequency increases. Thus, the optimum ovenized resonator design for low power consumption strongly depends on the phase noise requirements, circuit technology and operating frequency. One major task of this project is to explore and optimize ovenized oscillators across this design space and produce optimized demo units at technically relevant frequencies.

Another unique aspect of AlN microresonator technology is that the heater/temperature sensor can be integrated directly on the resonator. While poor phase noise electrostatic MEMS oscillators have been ovenized, the power consumption was 9.6 times higher than our results because other technologies are not compatible with placing the oven directly on the resonator (it is placed beside the resonator on the same substrate). In addition, ovenized temperature stabilization, heater and control electronics, has not been reported for MEMS oscillators. The resonator shown in FIG. 4 vibrates in a mode where the resonant frequency is set by thickness. While this makes acoustically isolating the resonators from the heaters straight forward, it also limits the resonators to a single operating frequency per wafer and operating frequencies below 1000 MHz are impractical using thickness mode resonators as the thickness becomes too great to practically deposit and the oven power increases due to the increased volume. One of the major challenges of this program will be integrating the heaters on lateral mode resonators where the resonant frequency is set lithographically (i.e. many frequencies can be achieved on a single substrate) and the acoustic wave travels in the plane of the wafer, making acoustic isolation from the heaters challenging, especially at low frequencies. We will investigate methods, using modeling and micromachining, of isolating the propagating acoustic waves from the heaters while still having the two in intimate thermal contact. In addition, we will investigate locations directly on the resonators, such as locations of maximum displacement and minimum strain, where pattering heaters introduces minimal degradation of the resonator Q.

Figure 12:
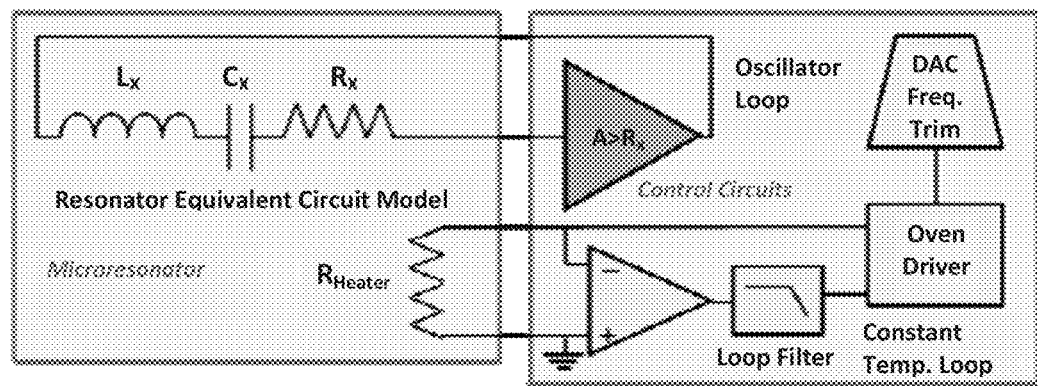
FIG. 12 shows a block diagram of the proposed ovenized oscillator showing the oscillator and temp. cntrl. feedback loops.
Figure 13:
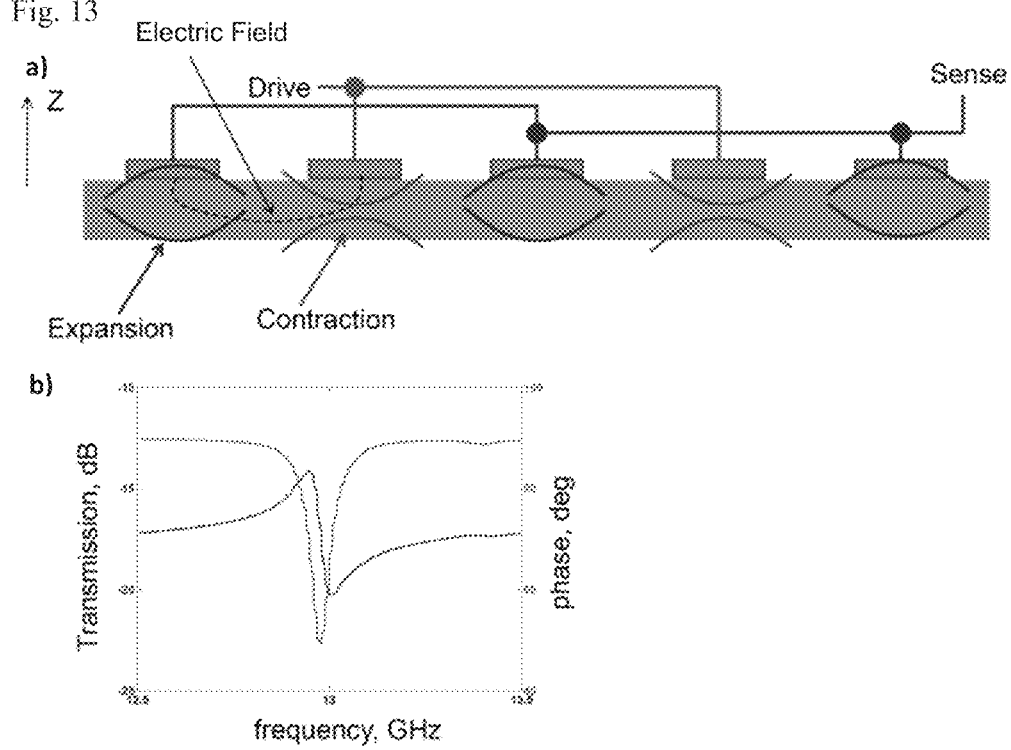
FIG. 13 shows (A) a schematic of LFBAR operation and (B) a graph of transmission or phase versus frequency.
Figure 14:
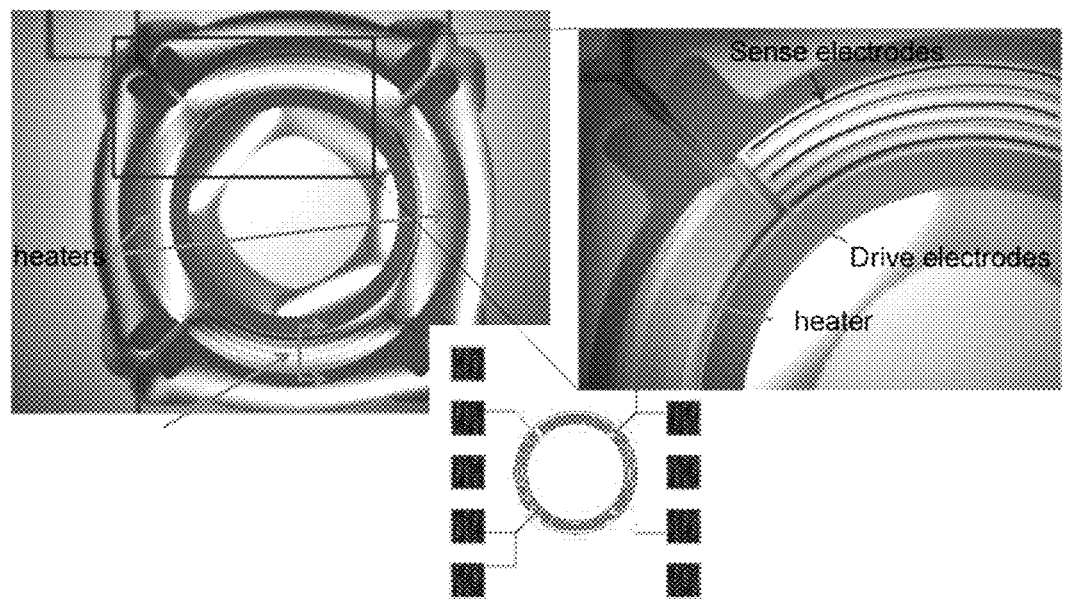
FIG. 14 shows Lateral FBAR (LFBAR) with heaters, where the speed of AlN ~10 km/s and no bottom electrode are provided in this process run. This run requires thin AlN (315 nm) to obtain fundamental mode resonators at 12.6 GHz.

In the noise calculations discussed above, the temperature stability, 0.5 ppb, was limited by the ovenizing current source. If a lower noise oven driver can be found, an order of magnitude better temperature stability can be achieved based on the thermal noise of the heater and typical amplifier noise. A block diagram of the ovenized oscillator is shown in FIG. 12. Shown are two feedback loops, one for sustaining oscillation and one for ovenized loops, one for sustaining oscillation and one for ovenized temperature control. The oven temperature is programmable with a DAC to trim as fabricated resonator frequency variations. We will research low noise circuits for realizing the oven control and demonstrate these circuits 1st at the PCB and later at the IC level. Particular attention must be paid to ensure the electronics, which are not ovenized, due not introduce temperature shifts in the oscillator output frequency. For example, if the oscillation sustaining amplifier is operated near its 3 dB bandwidth, a temperature induced change in the transconductance could cause a phase shift though the amplifier and subsequently shift the oscillator frequency. These effects can be modeled and mitigated by simulating the oscillator across transistor process corners and temperature and by using high-Q resonators. We will study the thermal time constant for external electronics to heat the resonator in different applications by measuring the Allan deviation. This heating profile determines the optimum loop bandwidth for the temperature control in FIG. 12, where longer time constants result in improved temperature stability provided the loop can track the thermal changes. Finally, we believe, based on modeling, quartz literature and the frequency response of the measured data, that the measured MEMS frequency reference vibration sensitivity (0.2 ppb/G) was limited by phase changes thru the wire bonds connecting the resonator and oscillator circuitry. We will test the ovenized, monolithic oscillators on a shaker table to determine the improvement in vibration sensitivity resulting from electronics/MEMS integration. While AlN MEMS has demonstrated low phase noise performance comparable to TCXOs and OCXOs, the temperature stability is poor. With the orders of magnitude reductions in frequency drift over temperature that will be realized under this project, one can see that this technology will be breaking new ground in providing small, low noise, low power temperature stable frequency sources.

Example 3

Ovenized and Thermally Tunable Aluminum Nitride Microresonators

Background, Motivation and Objective: Recently, single chip AlN MEMS oscillators have demonstrated phase noise, −96 dBc/Hz@1 kHz offset from a 532 MHz carrier, suitable for RF communications. While initial results are promising, both the microresonator initial accuracy, ~300 ppm, and temperature sensitivity, 2 ppm/° C., are too high for precision oscillators.

Statement of Contribution/Methods: The small volume and thermal isolation from the substrate of microresonators provides a new platform for ovenizing and thermally tuning resonators at revolutionary low power levels, <3 mW compared to >1 W for quartz crystals. Shown in FIG. 4 is a 627 MHz AlN ring resonator with an integrated thin film Al heater. We have investigated the thermal tuning and ovenization of ring and bar resonator geometries excited in 627 MHz Lame' and 12.7 GHz thickness modes.

Figure 15:
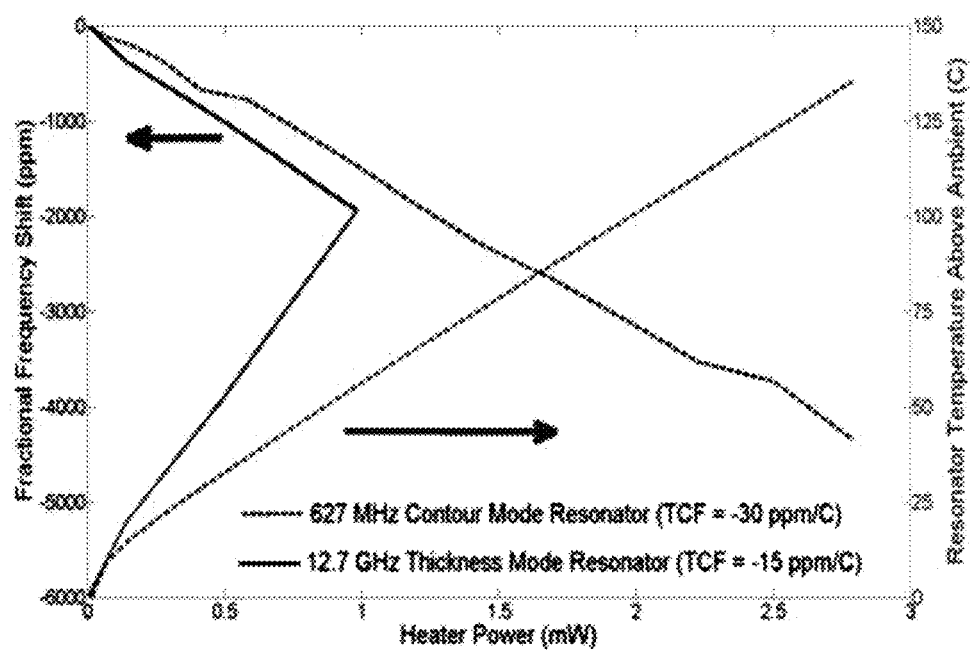
FIG. 15 shows a plot of functional frequency shift and temperature vs. heater power in vacuum for ring resonators at 627 MHz (lateral mode) and 12.7 GHz (thickness mode).

Results: Plotted in FIG. 15 is the fractional frequency shift and temperature vs. heater power in vacuum for ring resonators at 627 MHz (lateral mode) and 12.7 GHz (thickness mode). The 627 MHz microresonator is thermally tunable by 4348 ppm via heating the resonator by 135° C. using only 2.8 mW of power. The resonator insertion loss varies from 4.4 dB at ambient temperature to 5 dB at 135° C. above ambient. The rise in resonator temperature was measured via the resistance of the heating element, which is nominally 2.217 kOhms and varies by 7.46 Ohms/° C. Noise analysis calculations that include the thermal noise of the heater, amplifier noise and the noise from a heater driver predict the resonator frequency can be stabilized to 0.5 ppb for a control loop bandwidth of 10 Hz.

Discussion and Conclusions: The reported results are promising for the thermal stabilization of low noise oscillators, for trimming fabrication offsets, and for realizing GHz tunable oscillators needed in miniature atomic clocks.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A lateral contour mode ovenized micro-electro-mechanical system (MEMS) resonator comprising:
    a substantially thermally isolated mechanical resonator having a top surface and a bottom surface;
    a first electrode coupled to the top surface of the substantially thermally isolated mechanical resonator;
    a heating element formed on the substantially thermally isolated mechanical resonator;
    a temperature sensor formed on the substantially thermally isolated mechanical resonator; and
    a second electrode coupled to the bottom surface of the substantially thermally isolated mechanical resonator,
    wherein the first and second electrodes are configured to generate an electric field through the substantially thermally isolated mechanical resonator and between the first and second electrodes, and
    wherein the lateral contour mode ovenized MEMS resonator provides acoustic waves that travel in the plane of the substantially thermally isolated mechanical resonator.

2. The lateral contour mode ovenized MEMS resonator of claim 1, wherein the substantially thermally isolated mechanical resonator further comprises:
    a substrate;
    a resonator; and
    at least one thermally isolating beam coupled to the substrate and the resonator, the at least one thermally isolating beam being disposed between the substrate and the resonator such that the substrate and the resonator are not in direct contact.

3. The lateral contour mode ovenized MEMS resonator of claim 2, wherein:
    the resonator is a circular resonator having a circumference; and
    the at least one thermally isolating beam comprises four thermally isolating beams coupled to the circumference of the circular resonator at equal intervals.

4. The lateral contour mode ovenized MEMS resonator of claim 2, wherein the resonator is one of a disk resonator, a bar resonator, or a ring resonator.

5. The lateral contour mode ovenized MEMS resonator of claim 2, wherein:
    the resonator is formed of aluminum nitride (AlN); and
    the at least one thermally isolating beam is formed of polycrystalline AlN.

6. The lateral contour mode ovenized MEMS resonator of claim 5, wherein the heating element is a resistive heating element formed of aluminum.

7. The lateral contour mode ovenized MEMS resonator of claim 2, wherein each of the at least one thermally isolating beams has a high length to width ratio.

8. The lateral contour mode ovenized MEMS resonator of claim 2, wherein:
    the first electrode comprises an oscillator electrical trace formed on at least one of the at least one thermally isolating beams and
    the heating element comprises a heating element electrical trace formed on at least one of the at least one thermally isolating beams.

9. The lateral contour mode ovenized MEMS resonator of claim 1, wherein the substantially thermally isolated mechanical resonator comprises a piezoelectric material.

10. The lateral contour mode ovenized MEMS resonator of claim 1, wherein the heating element is a resistive heating element.

11. The lateral contour mode ovenized MEMS resonator of claim 10, further comprising control circuitry electrically coupled to the resistive heating element.

12. The lateral contour mode ovenized MEMS resonator of claim 11, wherein the control circuitry comprises:
    a sensor circuitry to sense a relative resistance of the resistive heating element; and
    a drive circuitry to control a current provided to the resistive heating element based on the sensed relative resistance.

13. The lateral contour mode ovenized MEMS resonator of claim 1, wherein the heating element is a plurality of heating elements arranged substantially symmetrically on a surface of the substantially thermally isolated mechanical resonator.

14. The lateral contour mode ovenized MEMS resonator of claim 1, wherein the temperature sensor is thermally coupled to the substantially thermally isolated mechanical resonator.

15. The lateral contour mode ovenized MEMS resonator of claim 1, wherein the temperature sensor uses thermally dependent changes in a resistance of the heating element to determine a relative temperature of the substantially thermally isolated mechanical resonator.

16. The lateral contour mode ovenized MEMS resonator of claim 1, further comprising a silicon dioxide layer formed on the substantially thermally isolated mechanical resonator.

17. The lateral contour mode ovenized MEMS resonator of claim 1, wherein the first electrode is a drive electrode.

18. The lateral contour mode ovenized MEMS resonator of claim 1, further comprising a third electrode coupled to the top surface of the substantially thermally isolated mechanical resonator.

19. The lateral contour mode ovenized MEMS resonator of claim 18, wherein the third electrode is a sense electrode.

* * * * *